US011227716B2

United States Patent
Hur et al.

(10) Patent No.: US 11,227,716 B2
(45) Date of Patent: Jan. 18, 2022

(54) INDUCTOR

(71) Applicant: SAMSUNG ELECTRO-MECHANICS CO., LTD., Suwon-si (KR)

(72) Inventors: Young Min Hur, Suwon-si (KR); Bourn Seock Kim, Suwon-si (KR); Dong Ho Han, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 704 days.

(21) Appl. No.: 16/031,341

(22) Filed: Jul. 10, 2018

(65) Prior Publication Data
US 2019/0180929 A1 Jun. 13, 2019

(30) Foreign Application Priority Data

Dec. 11, 2017 (KR) .................. 10-2017-0169457

(51) Int. Cl.
H01F 27/30 (2006.01)
H01F 5/00 (2006.01)
(Continued)

(52) U.S. Cl.
CPC ............ *H01F 27/327* (2013.01); *H01F 5/06* (2013.01); *H01F 17/0013* (2013.01);
(Continued)

(58) Field of Classification Search
CPC ...... H01F 27/327; H01F 5/06; H01F 17/0013; H01F 17/04; H01F 27/022; H01F 27/292;
(Continued)

(56) References Cited

U.S. PATENT DOCUMENTS 5,519,582 A * 5/1996 Matsuzaki ............ H01L 23/645
336/208
6,249,093 B1 * 6/2001 Takahata ................ H02N 2/062
310/323.02
(Continued)

FOREIGN PATENT DOCUMENTS

CN 1393021 A 1/2003
CN 104766715 A 7/2015
(Continued)

OTHER PUBLICATIONS

Office Action issued in corresponding Chinese Patent Application No. 201811318364.9 dated Nov. 20, 2020, with English translation.

Primary Examiner — Alexander Talpalatski
Assistant Examiner — Joselito Baisa
(74) Attorney, Agent, or Firm — Morgan, Lewis & Bockius LLP

(57) ABSTRACT

An inductor includes a support member; a coil including a plurality of coil patterns disposed on one surface or the other surface of the support member, an insulating layer surrounding the coil, and an encapsulant encapsulating the support member and the coil patterns. At least portions of the insulating layer may be disposed to be recessed from the one surface or the other surface of the support member toward a center of the support member.

20 Claims, 8 Drawing Sheets

(51) Int. Cl.
*H01F 27/32* (2006.01)
*H01L 23/522* (2006.01)
*H01F 5/06* (2006.01)
*H01F 27/02* (2006.01)
*H01F 17/04* (2006.01)
*H01F 27/29* (2006.01)
*H01F 17/00* (2006.01)

(52) U.S. Cl.
CPC .......... *H01F 17/04* (2013.01); *H01F 27/022* (2013.01); *H01F 27/292* (2013.01); *H01F 27/306* (2013.01); *H01F 27/324* (2013.01); *H01L 23/5227* (2013.01); *H01F 2017/048* (2013.01)

(58) Field of Classification Search
CPC ................ H01F 27/306; H01F 27/324; H01F 2017/048; H01F 27/2804; H01F 27/32; H01F 27/323
USPC ........................................................ 336/199
See application file for complete search history.

(56) References Cited

U.S. PATENT DOCUMENTS

| | | | |
|---|---|---|---|
| 6,303,971 B1 * | 10/2001 | Rhee | H01F 17/0033 257/531 |
| 6,417,755 B1 * | 7/2002 | Liu | H01F 17/0006 29/602.1 |
| 6,560,864 B1 * | 5/2003 | Chang | H01F 17/0006 29/604 |
| 9,236,171 B2 * | 1/2016 | Ito | H01F 5/003 |
| 9,640,603 B2 * | 5/2017 | Padmanathan | H01L 28/10 |
| 9,812,257 B2 * | 11/2017 | Itoh | H01F 17/0013 |
| 10,251,280 B2 * | 4/2019 | Williams | H01F 5/00 |
| 10,770,215 B2 * | 9/2020 | Ito | H01F 7/08 |
| 2003/0052765 A1 | 3/2003 | Kanetaka et al. | |
| 2005/0093668 A1 * | 5/2005 | Bueyuektas | H01L 27/08 336/200 |
| 2011/0248380 A1 * | 10/2011 | Yoshihara | H01F 5/003 257/531 |
| 2013/0293337 A1 | 11/2013 | Lo et al. | |
| 2015/0294789 A1 | 10/2015 | Sano et al. | |
| 2015/0380152 A1 | 12/2015 | Itoh et al. | |
| 2017/0062121 A1 * | 3/2017 | Yang | H01F 17/0013 |
| 2020/0335254 A1 | 10/2020 | Park et al. | |

FOREIGN PATENT DOCUMENTS

| | | |
|---|---|---|
| JP | H10-125533 A | 5/1998 |
| KR | 10-1999-0066108 A | 8/1999 |
| KR | 10-2003-0020603 A | 3/2003 |
| KR | 10-2015-0079935 A | 7/2015 |
| TW | 201735066 A | 10/2017 |

* cited by examiner

INDUCTOR

CROSS-REFERENCE TO RELATED APPLICATION

This application claims benefit of priority to Korean Patent Application No. 10-2017-0169457 filed on Dec. 11, 2017 in the Korean Intellectual Property Office, the disclosure of which is incorporated herein by reference in its entirety.

BACKGROUND

1. Field

The present disclosure relates to an inductor, and more particularly, to a high inductance thin film type power inductor including a coil having a high aspect ratio (AR).

2. Description of Related Art

In accordance with the development of information technology (IT), apparatuses have been rapidly miniaturized and thinned. Therefore, market demand for small, thin devices has increased.

In accordance with such a technical trend, Korean Patent Laid-Open Publication No. 10-1999-0066108 provides a power inductor including a substrate having a via hole and coils disposed on opposite surfaces of the substrate and electrically connected to each other through the via hole of the substrate in an effort to provide an inductor including coils having a uniform and large aspect ratio (AR).

In addition, in a design of the power inductor, upper and lower coils are generally connected to each other by filling the via hole. In this case, a line width of a via hole pad portion is designed to be greater than that of another coil pattern that is wound. Therefore, the via hole pad portion is more rapidly grown as compared to the line width of the coil pattern, and it may be difficult to provide a pattern plating having a desired thickness without a plating deviation when an additional planarization process is not performed later.

SUMMARY

An aspect of the present disclosure may provide an inductor including a coil implemented to have a high aspect ratio (AR) and a fine line width, in which insulation reliability between adjacent coil patterns may be improved.

According to an aspect of the present disclosure, an inductor may include: a body including a support member including a via hole and a through-hole, a coil including a plurality of coil patterns disposed on one surface or the other surface of the support member, an insulating layer surrounding the plurality of coil patterns, and a magnetic material encapsulating the support member and the coil; and an external electrode disposed on an external surface of the body. At least portions of the insulating layer may be recessed from the one surface or the other surface of the support member toward a center of the support member.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, an inductor according to an exemplary embodiment in the present disclosure will be described. However, the present disclosure is not necessarily limited thereto.

Figure 1:
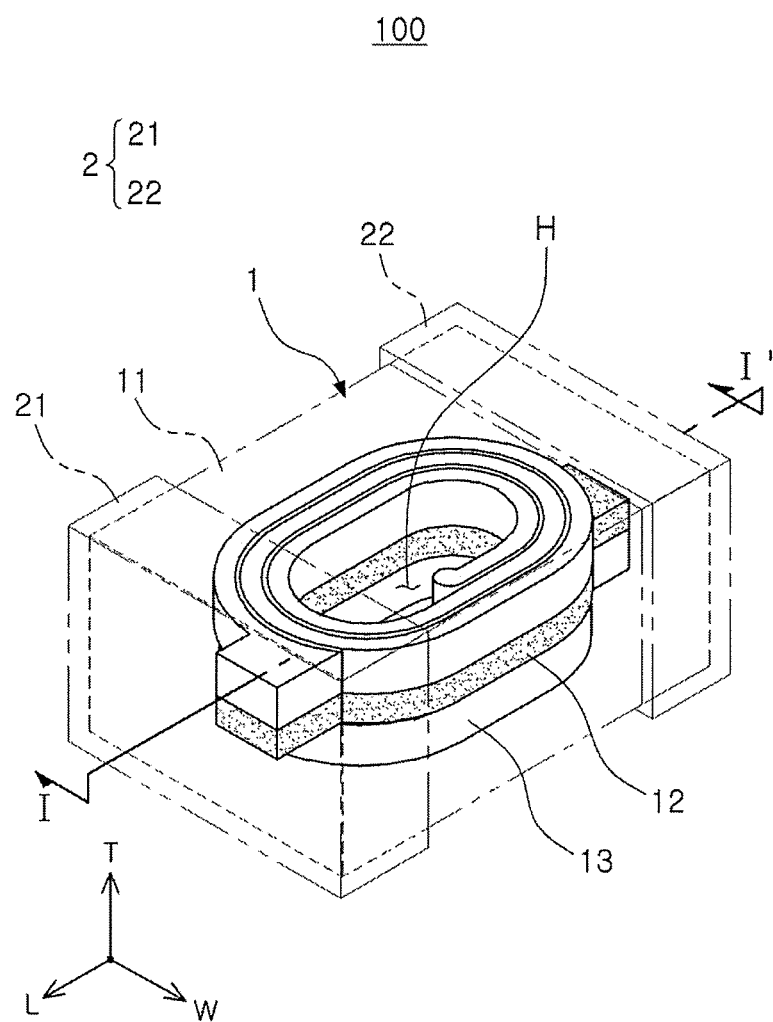
FIG. 1 is a schematic perspective view illustrating an inductor according to an exemplary embodiment in the present disclosure.
Figure 2:
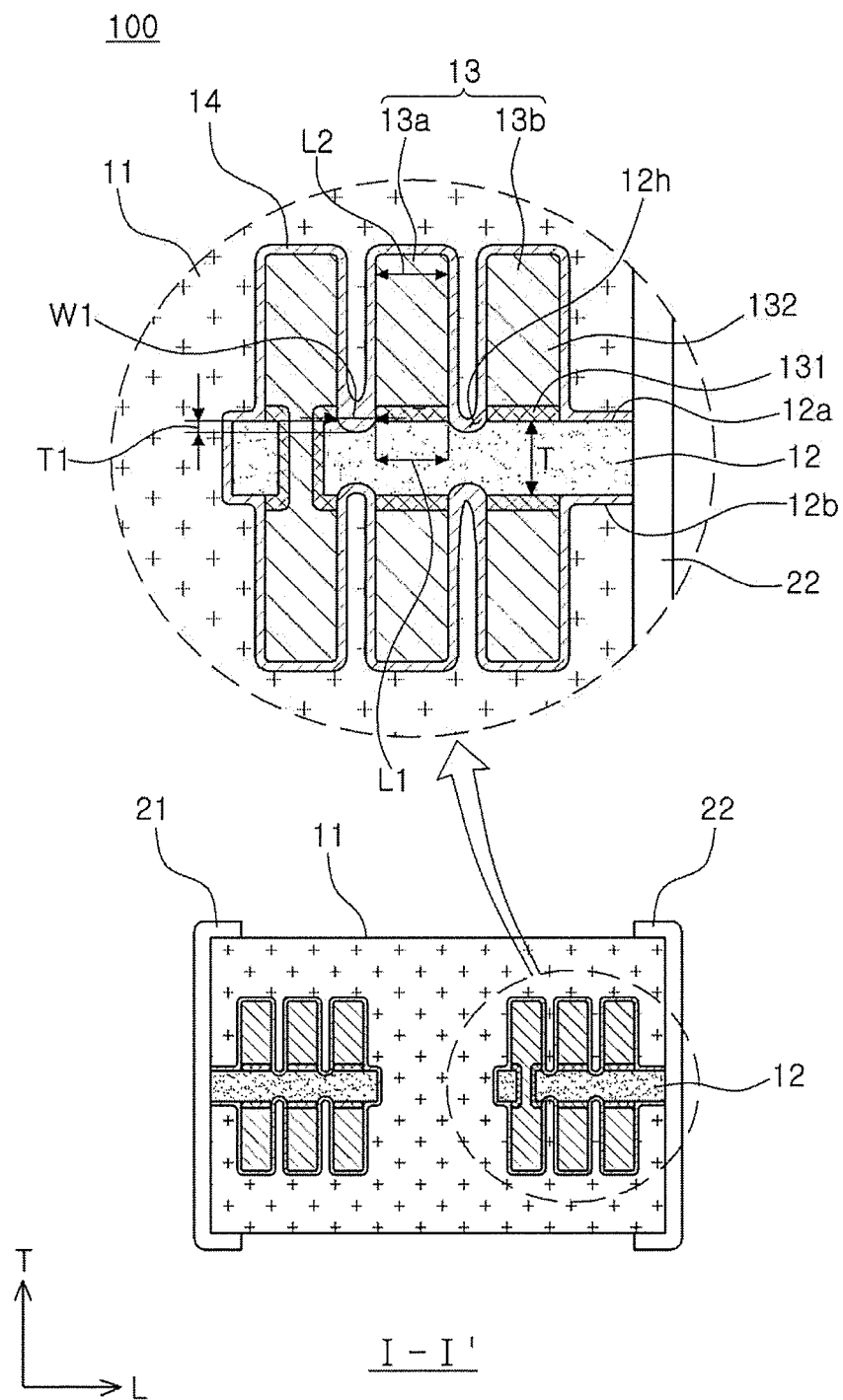
FIG. 2 is a cross-sectional view taken along line I-I' of FIG. 1.

FIG. 1 is a schematic perspective view illustrating an inductor according to an exemplary embodiment in the present disclosure, and FIG. 2 is a cross-sectional view taken along line I-I' of FIG. 1.

Referring to FIGS. 1 and 2, an inductor 100 may include a body 1 and an external electrode 2 disposed on an external surface of the body. The external electrode may include a first external electrode 21 and a second external electrode 22 facing each other and functioning as different polarities.

The body 1 may substantially form an appearance of the inductor, and may have upper and lower surfaces opposing each other in a thickness direction T, first and second end surfaces opposing each other in a length direction L, and first and second side surfaces opposing each other in a width direction W to thus substantially have a hexahedral shape.

The body 1 may include a magnetic material 11. The magnetic material may be a material having a magnetic property, for example, a material in which ferrite or metal magnetic particles are filled in a resin, and the metal magnetic particles may include one or more selected from the group consisting of iron (Fe), silicon (Si), chromium (Cr), aluminum (Al), and nickel (Ni).

The magnetic material may serve as an encapsulant encapsulating a support member 12 to be described below and a coil 13 supported by the support member 12.

The support member 12 may serve to support the coil 13, and may serve to allow the coil 13 to be more easily formed. The support member 12 may have appropriate rigidity for supporting the coil 13, may be formed of a material appropriately selected by those skilled in the art among materials having an insulation property, and may have a thin plate shape. The support member 12 may be, for example, a center core of any known copper clad laminate (CCL), or may be a photoimagable dielectric (PID) resin, an Ajinomoto build-up film (ABF), or the like. The support member 12 may also have a structure in prepreg, a glass fiber, or the like, is impregnated in a thin plate insulating resin.

At least one of one surface 12a of the support member 12 and the other surface 12b of the support member 12 opposing the one surface 12a may include predetermined concave portions 12h. The concave portions 12h may be formed from the one surface 12a or the other surface 12b toward the center of the support member 12. A cross-sectional shape of the concave portion may be appropriately selected by those skilled in the art, but may be a shape that becomes relatively narrow toward the center of the support member 12 since the concave portion 12h is etched from the one surface 12a or the other surface 12b of the support member 12 toward the center of the support member 12 when the concave portion 12h is formed. In other words, the cross-sectional shape of the concave portion 12h may be a tapered shape (not shown) of which a width is decreased toward a downward direction. However, the cross-sectional shape of the concave portion is not limited thereto, but may be a rectangular shape, a trapezoidal shape, a reverse trapezoidal shape, or the like (not shown).

A depth T1 and a maximum width W1 of the concave portion 12h may be appropriately set as needed by those skilled in the art. However, the depth T1 may be 0.45 or less of an entire thickness T of the support member. The reason is that when the depth T1 is greater than 45% of the entire thickness T of the support member, a risk that the concave portion 12h formed in the one surface 12a of the support member 12 and the other concave portion 12h formed in the other surface 12b of the support member 12 will penetrate through the support member 12 while the chance of meeting each other is increased. In addition, the width W1 of the concave portion 12h may be approximately the same as a width of a space between coil patterns 13a and 13b adjacent to each other in a same plane with the concave portion 12h interposed therebetween.

The concave portion 12h refers to an empty space formed by removing a portion of a surface of the support member 12, and may be filled with an insulating layer or a magnetic material. The concave portion 12h may be formed between adjacent coil patterns 13a and 13b in a same plane. The concave portion 12h may serve to prevent a short-circuit between the adjacent coil patterns 13a and 13b in a same plane, which will be described in detail with respect to a method of manufacturing an inductor 100 to be described below. However, the method of manufacturing an inductor 100 is not limited to only the following description.

Figure 3A:
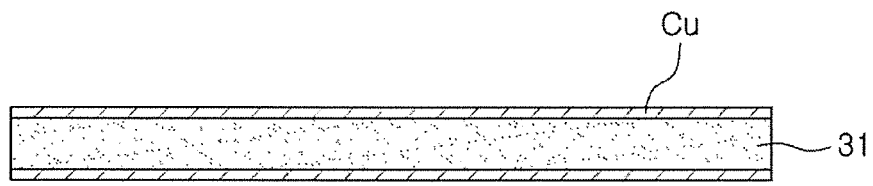
FIGS. 3A through 3J are views illustrating an example of a method of manufacturing the inductor of FIGS. 1 and 2.
Figure 3B:
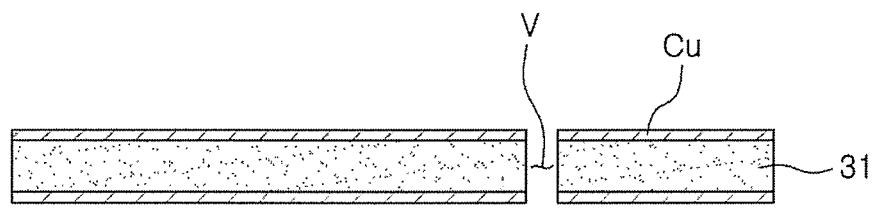
Figure 3C:
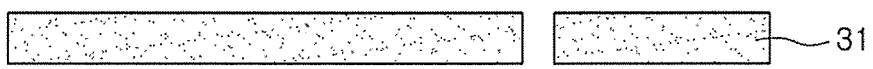

Referring to FIGS. 3A through 3J, an insulating substrate 31 that may be utilized as the support member 12 may be prepared (see FIG. 3A). A via hole V having a predetermined diameter may be formed in the insulating substrate 31 (see FIG. 3B). Then, metal layers such as copper (Cu) plating layers, or the like, formed on upper and lower surfaces of the insulating substrate 31 may be peeled off (see FIG. 3C). However, a process of peeling off the metal layers may be omitted when the metal layers are not disposed on the upper and lower surfaces of the prepared insulating substrate 31.

Figure 3D:
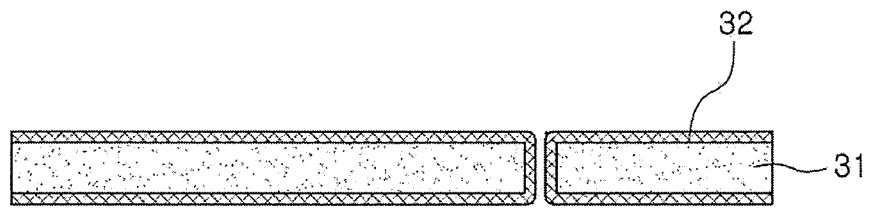

Then, seed layers 32 may be formed on the upper and lower surfaces of the insulating substrate 31 (see FIG. 3D). In this case, the seed layers 32 may be formed to surround side surfaces of the via hole. Alternatively, after the seed layers 32 are formed on only the upper and lower surfaces of the insulating substrate 31 except for the side surfaces of the via hole V, the via hole V may be filled by a separate process. In this case, the seed layers 32 may be formed by a method such as sputtering, chemical vapor deposition (CVD), chemical copper plating, or the like. For example, when the seed layers 32 are formed by the sputtering, a degree of freedom in selecting a material such as Mo, Al, Ti, W, and the like, may be increased. The seed layer 32 may be formed of a material that may be easily removed by a laser beam together with an insulator 33 to be described below, and since it is difficult to remove the seed layer 32 by a process to be described below when the seed layer 32 is excessively thick. A thickness of the seed layer 32 may not exceed 2 µm.

Figure 3E:
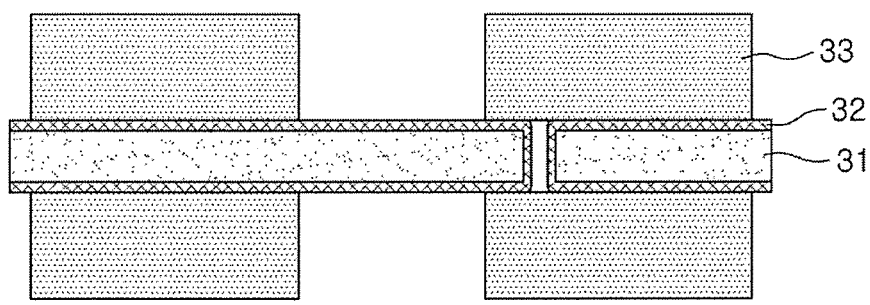

Then, insulators 33 may be laminated on the seed layers (see FIG. 3E). In this case, the insulator 33 may have a structure in which a plurality of insulating sheets are stacked or have a structure in which one thick insulator layer 33 is integrally formed. The insulator 33 may include a photosensitive insulating material such as epoxy.

Figure 3F:
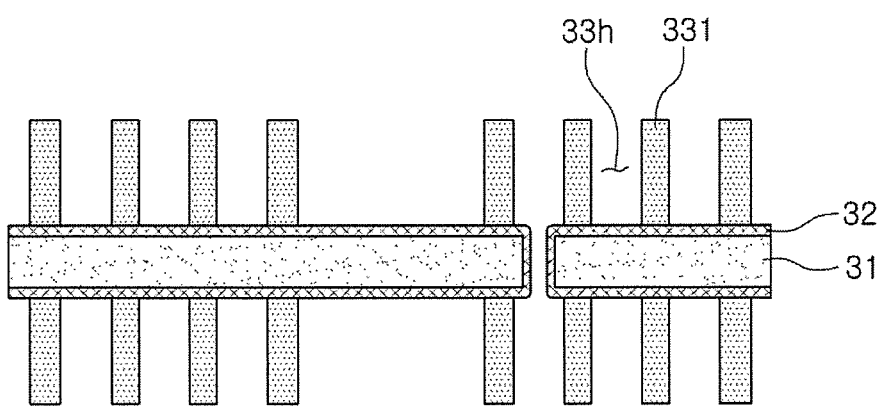

The insulators 33 may be patterned in a shape corresponding to coil patterns (see FIG. 3F). The patterning maybe performed by exposure and development processes. In this case, an aspect ratio (AR) of each of insulators 331 that are patterned and remained may be appropriately selected. However, a line width and the aspect ratio (AR) of each of the insulators 331 may be 40 µm or less and 6 µm or more, respectively, in order to implement coil patterns having a high aspect ratio (AR) and a fine line width. Openings 33h exposing the seed layers 32 on the insulating substrate 31 may be formed by the patterning using e.g. photolithography such as ultraviolet (UV) photolithography, deep ultraviolet (DUV) photolithography, or extreme ultraviolet (EUV) photolithography.

Figure 3G:
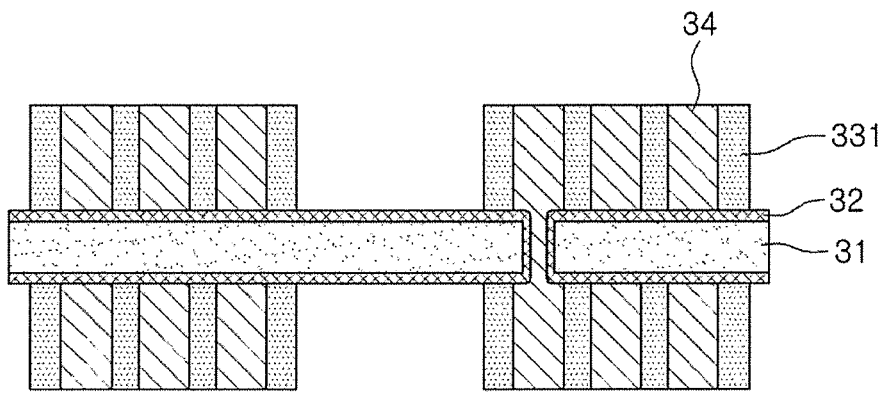

The openings 33h of the insulators may be filled with coil patterns 34 (see FIG. 3G). The coil patterns 34 may be formed by a plating process using the seed layers 32 as seed layers, but are not limited thereto. A central portion of the via hole V may be filled by a process of filling the coil patterns 34.

Then, although not illustrated in detail, an upper surface of the insulator 331 may be disposed on the same level as that of an upper surface of the coil pattern 34 or be disposed on a level above the upper surface of the coil pattern 34. However, when the upper surface of the insulator 331 is disposed on a level below the upper surface of the coil pattern 34, that is, when the coil pattern 34 is excessively plated, a separate polishing process may be performed to allow the upper surface of the insulator 331 and the upper surface of the coil pattern 34 to be disposed on the same level.

Figure 3H:
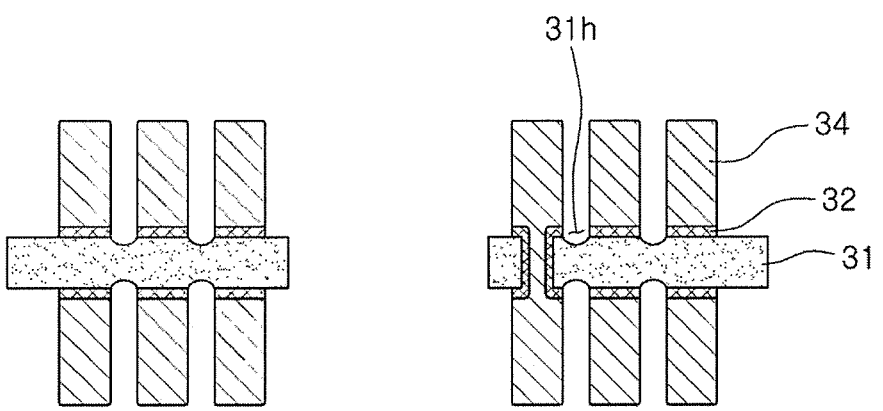

In addition, the insulators 331 remaining between adjacent coil patterns 34 may be removed using a laser beam (see FIG. 3H). In this case, the insulators 331 and the seed layers disposed beneath the insulators 331 need to be removed together, which may be performed by appropriately setting a laser beam irradiation condition by those skilled in the art. The seed layers 32 disposed beneath the insulators 331 needs to be completely removed, and when the remaining seed layer 32 is generated, there may be a risk that a short-circuit will occur between the adjacent coil patterns 34. Therefore, in a process of removing the insulators 331 using the laser beam, concave portions 31h may be formed in portions of one surface or the other surface of the insulating substrate 31 to prevent the risk that the short-circuit will occur. A width and a depth of the concave portion 31h need to be appropriately selected by those skilled in the art, and the depth of the concave portion 31h needs to be a depth at which conduction between the concave portion 31h formed from the one surface of the insulating substrate 31 and the concave portion 31h formed from the other surface of the insulating substrate 31 is not generated.

Figure 3I:
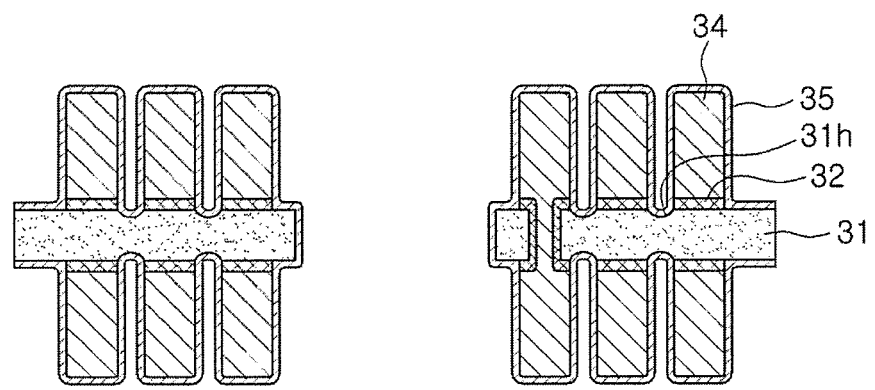
Figure 3J:
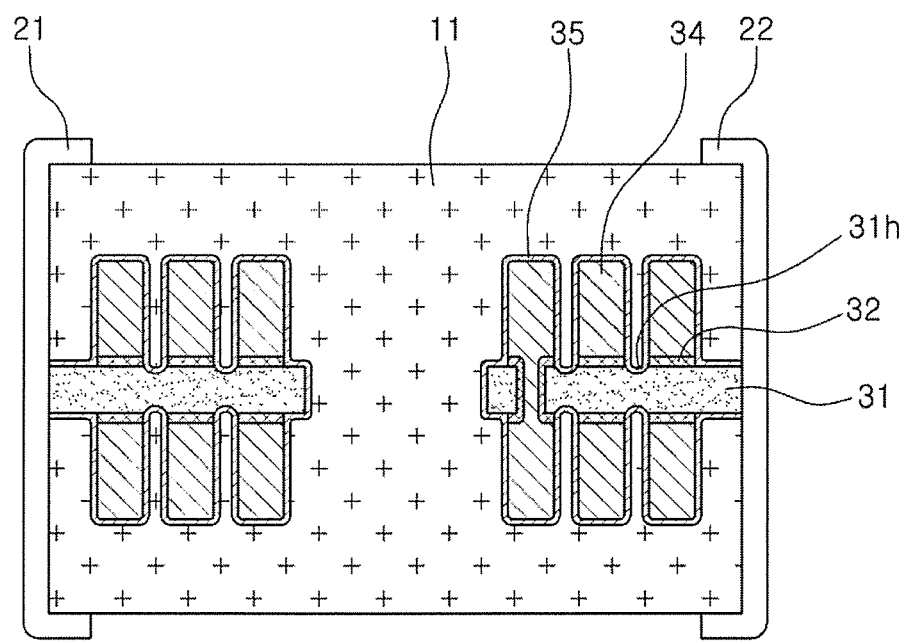

After the insulators 331 are completely removed and the concave portions 31h are formed on the surface of the insulating substrate 31, an insulating layer 35 having a predetermined thickness may be coated on surfaces of the coil patterns 34 (see FIG. 3I). The insulating layer 35 maybe also formed in at least portions of the concave portions 31h. The insulating layer 35 may be formed for insulation between the adjacent coil patterns 34 and insulation between the coil patterns 34 and a magnetic material encapsulating the coil patterns 34.

In addition, the inductor 100 may be manufactured by finishing processes such as a process of filling the magnetic material 11 encapsulating both of the support member 12 and the coil 13, a plating process for forming an external electrode 21 or 22, and the like.

Again referring to FIG. 2, the coil 13 may be supported by the support member 12. The coil 13 may include a plurality of coil patterns 13a and 13b. Each of the plurality of coil patterns 13a and 13b may include a seed layer 131 and one or more plating layers 132 disposed on the seed layer 131. The seed layer 131 may be prepared by a process of forming the seed layer 32 illustrated in FIG. 3D, and a specific thickness of the seed layer 131 may be smaller than 2 µm, and may be 50 nm or more to 1 µm or less. The seed layer 131 may be formed of a copper (Cu) alloy, or may include one or more of Mo, Ni, Al, Ti, and W. When the seed layer 131 is formed of the copper alloy, only the seed layer 131 formed of the copper alloy, in contact with lower surfaces of the insulators 331 except for the seed layer 131 formed of the copper alloy, in contact with lower surfaces of the plating layers 132 needs to be selectively removed by the process of removing the insulators 331 by the laser beam, and the seed layer 131 may thus be thin enough to be easily removed.

The plating layer 132 disposed on the seed layer 131 may be a coil portion substantially determining an aspect ratio (AR) of the coil 13, and since the insulator 331 functions as a guide, the plating layer 132 may be implemented by a coil pattern 34 substantially having a rectangular cross-sectional shape and having a large thickness of about 200 µm. The plating layer 132 may include a material having excellent electrical conductivity, such as a copper (Cu) alloy.

A line width of the seed layer 132 and a line width of the plating layer 132 may be substantially the same as each other. The reason is that the plating layer 132 is formed to fill the opening of the insulator 331. In addition, the reason is that the insulator 331 between the adjacent coil patterns 34 serves to control a shape of the plating layer 132 and guide a plating growth direction of the plating layer 132.

In addition, the line width L1 of the seed layer 131 and a line width L2 of the outermost plating layer 132 disposed farthest from the support member 12 among the plating layers 132 may be substantially the same as each other. In FIGS. 3A through 3J, since the number of plating layers 132 is only one, the outermost plating layer 132 does not separately exist. However, even in a case in which the number of plating layers 132 is two or more, the line width L2 of the outermost plating layer 132 may be substantially the same as that of the seed layer 131.

An insulating layer 14 may be applied to surfaces of the coil patterns 13a and 13b. A thickness of the insulating layer 14 may be 1 µm or more to 10 µm or less. When the thickness of the insulating layer 14 is smaller than 1 µm, insulation reliability of the insulating layer may not be secured, and when the thickness of the insulating layer 14 is greater than 10 µm, a space in which a magnetic material may be filled may be excessively limited, which is disadvantageous in inductance.

Since the insulating layer 14 is in contact with upper surfaces of the concave portions 12h, the insulating layer 14 may have a structure in which it is recessed from one surface 12a and the other surfaces 12b of the support member 12 toward the center of the support member 12.

Meanwhile, as the width W1 or the depth T1 of the concave portion 12h becomes large, the concave portion may be filled with a magnetic material in addition to the insulating layer 14, which will be described with reference to FIG. 4.

Figure 4:
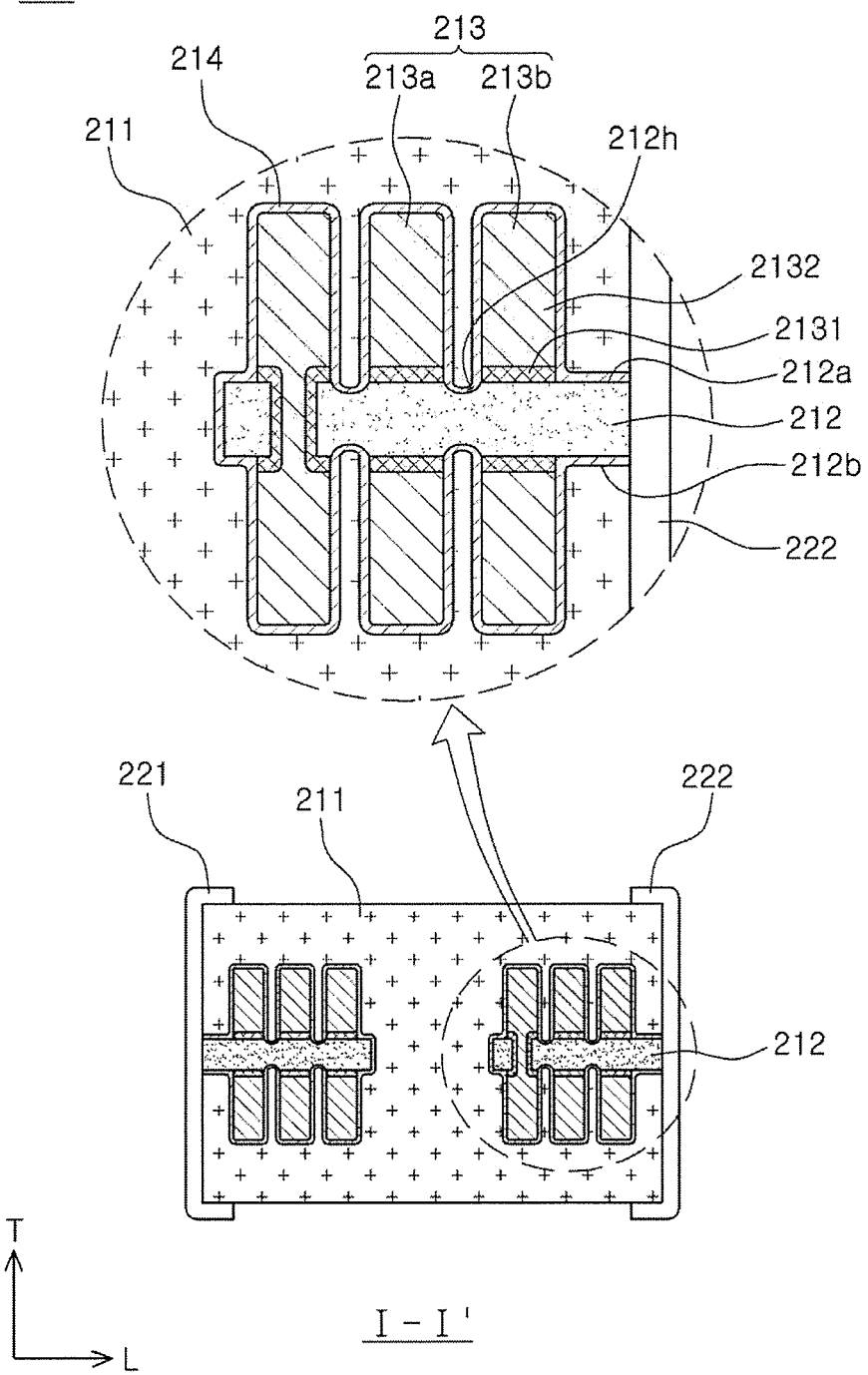
FIG. 4 is a cross-sectional view illustrating an inductor according to a modified example of the inductor of FIGS. 1 and 2.

An inductor 200 of FIG. 4 having external electrodes 221 and 222 is different from the inductor 100 of FIGS. 1 and 2 in that a space between adjacent coil patterns is greater than that between the adjacent coil patterns of the inductor 100. For convenience of explanation, a description for components overlapping those described above is omitted, and contents different from those described above are mainly described.

Referring to FIG. 4, a concave portion 212h maybe filled with a magnetic material 211 as well as an insulating layer 214. Since the insulating layer 214 is not thick enough to completely the concave portion, a portion of the concave portion 212h remaining after being filled with the insulating layer 214 may be filled with the magnetic material.

Figure 5:
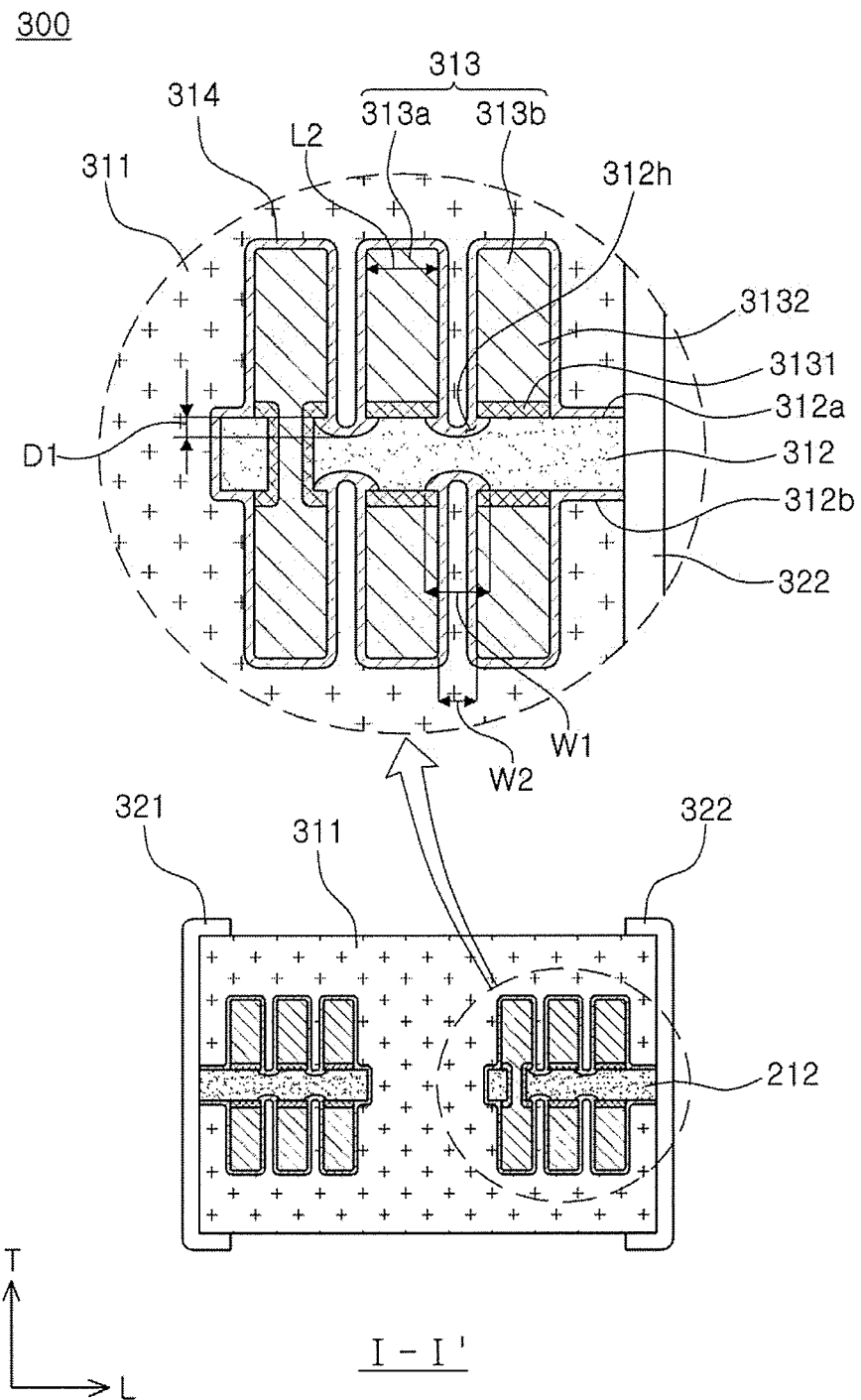
FIG. 5 is a cross-sectional view illustrating an inductor according to another modified example of the inductor of FIGS. 1 and 2.

Next, FIG. 5 is a cross-sectional view illustrating an inductor 300 having external electrodes 321 and 322 according to another modified example of the inductor 100 of FIGS. 1 and 2. In the inductor 300 of FIG. 5, a concave portion 312h may be formed to have a width W1 greater than a width W2 between adjacent coil patterns 313a and 313b. In this case, an insulating layer 313 may be disposed in a space of the concave portion 312h as described above, and since the concave portion 312h is formed to have a relatively great width, the possibility that a seed layer 3131 will not exist between the adjacent coil patterns 313 may be certainly secured. In this case, a depth level D1 by which the concave portion 312h extends to a lower surface of a coil pattern 313 adjacent to the concave portion 312h may be 0.4 or less of a width L2 of the coil pattern 13a. The purpose of this may be to prevent delamination between the coil patterns 13a and a support member 12 supporting the coil patterns 313.

According to the inductor 300 described above, a decrease of reliability of the inductor 300 due to a short-circuit between the coil patterns 313 in a structure in which a line width is fine and a space between adjacent coil patterns 313a and 313b is small may be prevented. As described above, the short-circuit of the inductor may be suppressed, such that an aspect ratio (AR) of the coil 313 may further be increased, and a line width of the space between the coil patterns 313a and 313b may become finer. Resultantly, a demand for a high inductance thin film inductor 300 that is miniaturized may be stably satisfied.

As set forth above, according to the exemplary embodiments in the present disclosure, an inductor in which D.C. resistance Rdc characteristics are improved and insulation reliability between coil patterns at a small chip size is enhanced may be provided.

While exemplary embodiments have been shown and described above, it will be apparent to those skilled in the art that modifications and variations could be made without departing from the scope of the present invention as defined by the appended claims.

What is claimed is:

1. An inductor comprising:
  a body including
    a support member including a via hole and a through-hole,
    a coil including a plurality of coil patterns disposed on one surface or the other surface of the support member,
    an insulating layer surrounding the coil, and
    a magnetic material encapsulating the support member and the coil; and
  an external electrode disposed on an external surface of the body,
  wherein at least first portions of the insulating layer are disposed on the coil and at least second portions of the insulating layer extend to be recessed from the one surface or the other surface of the support member toward a center of the support member, and the at least second portions being wider than the at least first portions.

2. The inductor of claim 1, wherein each of the plurality of coil patterns includes a seed layer and one or more plating layers disposed on the seed layer.

3. The inductor of claim 2, wherein the seed layer has a thickness of a range from 50 nm to 1 μm.

4. The inductor of claim 2, wherein a width of an upper surface of the seed layer is the same as that of a lower surface of the plating layer.

5. The inductor of claim 2, wherein a material of the seed layer is the same as that of the plating layer.

6. The inductor of claim 5, wherein each of the seed layers and the plating layers includes a copper (Cu) alloy.

7. The inductor of claim 2, wherein a material of the seed layer is different from that of the plating layer.

8. The inductor of claim 7, wherein the seed layer includes an alloy of one or more of Mo, Ni, Al, Ti, and W.

9. The inductor of claim 7, wherein the plating layer includes a copper (Cu) alloy.

10. The inductor of claim 2, wherein a maximum line width of the seed layer is the same as that of a plating layer disposed farthest from the support member among the one or more plating layers.

11. The inductor of claim 1, wherein the one surface or the other surface of the support member disposed between adjacent coil patterns of the plurality of coil patterns includes a plurality of concave portions formed from the one surface or the other surface toward the center of the support member.

12. The inductor of claim 11, wherein a cross-sectional shape of each of the plurality of concave portions is a tapered shape.

13. The inductor of claim 11, wherein the concave portion is filled with at least one of the insulating layer and the magnetic material.

14. The inductor of claim 11, wherein a depth of the concave portion is 0.45 or less of an entire thickness of the support member.

15. The inductor of claim 11, wherein a width of an upper surface of the concave portion is greater than that of a space between the adjacent coil patterns.

16. The inductor of claim 11, wherein a length by which the concave portion extends to a lower surface of a coil pattern facing the concave portion is 0.4 or less of a line width of the coil pattern.

17. An inductor comprising:
   a body including
      a support member including a via hole and a through-hole,
      a coil including a plurality of coil patterns on the support member,
      an insulating layer including first portions covering the coil and second portions extending onto an outer concave surface of the support member, the second portions being wider than the first portions, and
      a magnetic material encapsulating the support member and the coil; and
   an external electrode on an external surface of the body.

18. The inductor of claim 17, wherein each of the plurality of coil patterns includes a seed layer and one or more plating layers on the seed layer.

19. The inductor of claim 18, wherein the seed layer has a thickness of a range from 50 nm to 1 μm.

20. The inductor of claim 18, wherein a width of an upper surface of the seed layer is the same as that of a lower surface of the plating layer.

* * * * *